(12) United States Patent
Sumikawa et al.

(10) Patent No.: US 6,587,353 B2
(45) Date of Patent: Jul. 1, 2003

(54) SEMICONDUCTOR DEVICE

(75) Inventors: Masato Sumikawa, Kashihara (JP); Kazumi Tanaka, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/864,172

(22) Filed: May 25, 2001

(65) Prior Publication Data
US 2001/0045649 A1 Nov. 29, 2001

(30) Foreign Application Priority Data
May 25, 2000 (JP) ........................................ 2000-154788

(51) Int. Cl.[7] .............................. H05K 7/02; H05K 1/18
(52) U.S. Cl. ........................................ 361/760; 174/250
(58) Field of Search ................................ 361/748–751, 361/760–765, 772, 774, 777, 778, 783; 257/633, 705, 777; 174/250, 260, 261, 255, 256

(56) References Cited
U.S. PATENT DOCUMENTS

| | | | | |
|---|---|---|---|---|
| 4,813,129 A | * | 3/1989 | Karnezos ........................ | 29/832 |
| 5,345,365 A | * | 9/1994 | Herndon et al. ................ | 361/760 |
| 5,477,933 A | * | 12/1995 | Nguyen ........................ | 174/262 |
| 5,598,036 A | * | 1/1997 | Ho ................................ | 257/738 |
| 5,834,848 A | * | 11/1998 | Iwasaki ........................ | 257/778 |
| 5,847,456 A | * | 12/1998 | Shoji ............................ | 257/737 |
| 5,886,409 A | * | 3/1999 | Ishino et al. .................. | 257/737 |
| 6,050,832 A | * | 3/2000 | Lee et al. ...................... | 439/91 |
| 6,143,992 A | * | 11/2000 | Sato et al. .................... | 174/261 |
| 6,163,462 A | * | 12/2000 | Buck ............................ | 361/737 |
| 6,211,572 B1 | * | 4/2001 | Fjelstad et al. ............... | 257/781 |
| 6,228,686 B1 | * | 5/2001 | Smith et al. .................. | 438/117 |
| 6,284,563 B1 | * | 9/2001 | Fjelstad ........................ | 438/106 |
| 6,465,878 B2 | * | 10/2002 | Fjelstad et al. ............... | 257/668 |

* cited by examiner

*Primary Examiner*—David Martin
*Assistant Examiner*—Dameon E. Levi
(74) *Attorney, Agent, or Firm*—Birch, Stewart, Kolasch & Birch, LLP

(57) ABSTRACT

In the semiconductor device, externally connecting electrodes are placed on a semiconductor substrate. A rewiring pattern for connecting each on-chip electrode to corresponding external connecting electrode is routed, in the vicinity of the externally connecting electrode, in a direction where the effect of strain after mounting of the semiconductor substrate is small. Specifically, the rewiring pattern is routed such that the routing direction will not match the direction coupling the center of the semiconductor substrate to the externally connecting electrode along which large thermal stress is expected. Accordingly, strain that will occur at the rewiring pattern after mounting the semiconductor substrate to the mounting board is reduced. Adverse effects of the strain stress can be prevented without widening the externally connecting interconnection.

28 Claims, 7 Drawing Sheets

SEMICONDUCTOR DEVICE

BACKGROUND OF THE INVENTION

1. Field of the Invention

The present invention relates to semiconductor devices, and more particularly, to a semiconductor device having an interconnection structure preventing breaking of interconnection due to stress being applied to a semiconductor substrate after mounting thereof.

2. Description of the Background Art

In recent years, there exist increasing demands for more compact and more lightweight electronic components such as mobile telephones and mobile information equipment, and accordingly, miniaturization and more dense integration of semiconductor devices have been rapidly advancing. To this end, several proposals have been made. One proposal is bare chip mounting in which a large scale integrated (LSI) circuit chip is mounted directly on a circuit board. Another proposal is to provide a semiconductor device with a so called chip size package (CSP) structure in which the shape of the semiconductor device is made to follow that of the LSI chip as close as possible for miniaturization. In the semiconductor device with this CSP structure, instead of peripheral type electrode arrangement that is common to ordinary LSI chips, area array type electrode arrangement has increasingly been employed, which is advantageous in increasing the number of pins in a rewiring step.

FIG. 16 shows an example of the semiconductor device that is used in conventional bare chip mounting. As shown in FIG. 16, the semiconductor device 109 is formed of a bare chip 119, which is a semiconductor substrate not molded to a resin member, and a plurality of connecting portions 108. As shown in FIG. 17, bare chip 119 is connected via connecting portions 108 to electrodes 120 on a mounting board 121. With this structure, however, large thermal stress is generated due to a difference in thermal expansion between bare chip 119 and mounting board 121, causing damage to connection portions 108, and it is known that connecting portions 108 are unreliable.

Thus, as shown in FIG. 18, the gap between the undersurface of bare chip 119 and the surface of mounting board 121 is generally filled with a resin member 122 (this is called "underfill") to relax the thermal stress occurring in connecting portions 108.

The conventional semiconductor device 109 described with reference to FIG. 18 above has been proposed with aims to realize high-density mounting as in the bare chip mounting and to improve reliability by decreasing the thermal stress occurring in connecting portions 108 connecting bare chip 119 and mounting board 121. This semiconductor device, however, has the following disadvantages.

Resin member 122 filled in the gap between the undersurface of bare chip 119 and the surface of mounting board 121 makes repair of bare chip 119 extremely difficult, and an additional curing step of the resin increases the manufacturing cost of the semiconductor device. Handling of bare chip 119 itself is also difficult. Due to such reasons, the mounting structure of semiconductor device shown in FIG. 18 has failed to spread despite its possibility of realizing miniaturization and high-density mounting.

In addition, defects or generation of cracks after mounting have been reported. Such a crack would appear, due to strain caused by thermal stress after mounting bare chip 119 to mounting board 121, in an externally connecting interconnection for connecting soldering connecting portion 108 being an externally connecting electrode and an electrode on the semiconductor substrate being an on-chip electrode, and in a connecting interconnection routed from an electrode 120 provided in mounting board 121. In particular, there is a high possibility of breaking of the externally connecting interconnection of the semiconductor device, due to a crack that opens in a boundary between soldering connecting portion 108 (pad) in bare chip 119 as the semiconductor substrate and the externally connecting interconnection.

Further, in the structure of semiconductor device 109 shown in FIG. 16, the externally connecting electrodes have been arranged on bare chip 119 in a matrix. Thus, to route the external connecting interconnections from the electrodes on the semiconductor substrate, or on-chip electrodes, to the externally connecting electrodes being connected to the mounting board, they should be routed with high density along the gaps between the externally connecting electrodes. Accordingly, if the externally connecting interconnections are widened so as to ensure sufficient strength against strain thereof, there may arise a problem of crosstalk due to leakage of signal or generation of noise between circuits.

It is expected that spacing between externally connecting interconnections and the width of the interconnections themselves will be even narrowed, as there are tendencies for the electrode pitch on the semiconductor substrate to be increasingly narrowed, for the number of pins to be increased and for the chip size to be even reduced. Accordingly, there is a demand for a semiconductor device that has an interconnection structure taking into consideration relaxation of not only the stress applied to soldering connecting portions 108 but also the stress applied to the externally connecting interconnections being connected to soldering connecting portions 108. In other words, a semiconductor device is demanded which permits high-density wiring of externally connecting interconnections as in the bare chip mounting, which can be manufactured at the least possible cost, and which provides a mounting structure ensuring reliability not only in a single package, but also after mounting the semiconductor device on a mounting board.

SUMMARY OF THE INVENTION

An object of the present invention is to provide a semiconductor device having an interconnection structure that enables high-density wiring and prevents generation of a crack in an externally connecting interconnection being connected to an externally connecting electrode after mounting the semiconductor device on a mounting board.

The semiconductor device according to an aspect of the present invention includes: a substrate; an externally connecting electrode provided in the substrate; and an externally connecting interconnection electrically connected to the externally connecting electrode and routed along a surface of the substrate on which the externally connecting electrode is provided. In the vicinity of a position where the externally connecting interconnection is connected to the externally connecting electrode, a direction in which the externally connecting interconnection is routed has a crossing angle of greater than 0° and less than 180° with respect to a direction in which the substrate expands and contracts due to thermal stress in the position where the externally connecting interconnection is connected to the externally connecting electrode.

The structure described above exhibits the following effects. Assume that the substrate and another substrate to be electrically connected to the substrate via the externally connecting electrode have thermal expansion coefficients different from each other. In this case, after the substrate is mounted to the another substrate, the externally connecting interconnection in the vicinity of the externally connecting electrode would suffer strain stress of a magnitude corresponding to the difference between the thermal expansion coefficients of the substrate and the another substrate. According to the present invention, however, in the vicinity of the externally connecting electrode, the direction in which the externally connecting interconnection is routed and the direction in which the substrate expands and contracts due to the thermal stress have a certain crossing angle, i.e., they are deviated from each other. Thus, compared to the case where these two directions match with each other, the strain stress that would be applied to the externally connecting interconnection in the vicinity of the externally connecting electrode becomes small. As a result, the adverse effect of such strain stress on the externally connecting interconnection is alleviated, which improves reliability of the semiconductor device after the substrate is mounted to the another substrate. Further, the adverse effect of the strain stress can be prevented without increasing the width of the externally connecting interconnection, so that a semiconductor device having a high-density interconnection structure can be realized.

The semiconductor device according to another aspect of the present invention includes: a substrate having a main surface of a rectangular shape; an externally connecting electrode provided in the substrate; and an externally connecting interconnection electrically connected to the externally connecting electrode and routed along a surface of the substrate on which the externally connecting electrode is provided. In the vicinity of a position where the externally connecting interconnection is connected to the externally connecting electrode, a direction in which the externally connecting interconnection is routed has a crossing angle of greater than 0° and less than 180° with respect to a direction coupling an intersecting point of diagonal lines of the rectangular shape and the position where the externally connecting interconnection is connected to the externally connecting electrode.

The structure described above has the following effects. Assume again that the substrate and another substrate to be electrically connected to the substrate via the externally connecting electrode have thermal expansion coefficients different from each other. In this case, after the substrate is mounted to the another substrate, the externally connecting interconnection in the vicinity of the externally connecting electrode would suffer strain stress of a magnitude that corresponds to the difference between the thermal expansion coefficients of the substrate and the another substrate. According to the present invention, however, in the vicinity of the externally connecting electrode, the direction in which the externally connecting interconnection is routed and the direction coupling the intersecting point of the diagonal lines of the rectangular shape and the position where the externally connecting interconnection is connected to the externally connecting electrode have a certain crossing angle, i.e., they are deviated from each other. Thus, compared to the case where these two directions match with each other, the strain stress that would be applied to the externally connecting interconnection in the vicinity of the externally connecting electrode becomes small. As a result, the adverse effect of such strain stress on the externally connecting interconnection is alleviated, which improves reliability of the semiconductor device after the substrate is mounted to the another substrate. Further, the adverse effect of the strain stress can be prevented without increasing the width of the externally connecting interconnection, so that a semiconductor device with a high-density interconnection structure can be realized.

In the semiconductor device of the present invention according to either aspect above, at least the externally connecting interconnections connected to the externally connecting electrodes located in four corners of the substrate preferably have the crossing angles of greater than 0° and less than 180°. Such a structure improves reliability of the connections between the externally connecting intersections and the externally connecting electrodes in the four corners where the substrate is most likely to expand and contract due to thermal stress after mounting.

In the semiconductor device of the present invention according to either aspect above, all the externally connecting interconnections placed on the substrate preferably have the crossing angles of greater than 0° and less than 180°. With such a structure, in all the connecting positions between the externally connecting electrodes and the externally connecting interconnections, the strain stress being applied to the externally connecting interconnections can be made small. This suppresses generation of damages in all the externally connecting interconnections, so that the reliability of the semiconductor device is further improved.

In the semiconductor device of the present invention according to either aspect above, the crossing angle is preferably in a range between 45° and 135°. With such a structure, breaking of the externally connecting interconnections can be prevented. Further, the externally connecting interconnections can be placed with the least possible lengths.

In the semiconductor device of the present invention according to either aspect above, the crossing angle is more preferably in a range between 60° and 120°. With such a structure, the possibility of breaking of the externally connecting interconnections can further be reduced, while allowing the wiring thereof with the least possible lengths.

In the semiconductor device of the present invention according to either aspect above, the externally connecting electrodes may be placed near the periphery of the substrate. With such a structure, compared to the case where the connecting electrodes are provided near the center of the substrate, strength of the externally connecting electrode portions against torsion being applied around the central axis of the main surface of the substrate after the substrate is connected to the another substrate is increased.

In the semiconductor device of the present invention according to either aspect above, the externally connecting electrode and the semiconductor substrate may be provided with an insulating member interposed therebetween. The insulating member has an inclined plane with respect to the surface of the substrate on which the externally connecting electrode is provided, and the externally connecting interconnection is formed to follow the inclined plane. Since it is formed along the inclined plane of the insulating member, the externally connecting interconnection has a relatively smooth portion in the vicinity of the position where it is connected to the externally connecting electrode. Accordingly, it is possible to form all the portions of the externally connecting interconnections by deposition and etching of one time.

The semiconductor device of the present invention according to either aspect above may further include: another connecting electrode electrically connected to the externally connecting electrode; another substrate having the another connecting electrode provided therein; and another connecting interconnection having an end connected to the another connecting electrode and routed along a surface of the another substrate on which the another connecting electrode is provided.

In the semiconductor device of the present invention according to either aspect above, in the vicinity of a position where the another connecting interconnection and the another connecting electrode are connected to each other, a direction in which the another connecting electrode is routed may have a crossing angle of greater than 0° and less than 180° with respect to a direction in which the another substrate expands and contracts due to thermal stress in the position where the another connecting interconnection and the another connecting electrode are connected to each other.

The structure described above exhibits the following effects. In the vicinity of the another connecting electrode, the direction in which the another connecting interconnection is routed and the direction in which the another substrate expands and contracts due to the thermal stress have a certain crossing angle, i.e., they are deviated from each other. Thus, compared to the case where these two directions match with each other, the strain stress being applied to the another connecting interconnection in the vicinity of the another connection electrode becomes small. As a result, the adverse effect of the strain stress on the another connection interconnection is alleviated, so that reliability of the semiconductor device after mounting the substrate to the another substrate is improved.

Preferably, in the semiconductor device of the present invention according to either aspect above, the another substrate has a rectangular shape. In the vicinity of the position where the another connecting interconnection and the another connecting electrode are connected to each other, a direction in which the another connecting interconnection is routed may have a crossing angle of greater than 0° and less than 180° with respect to a direction coupling an intersecting point of diagonal lines of the rectangular shape of the another substrate to the position where the another connecting interconnection and the another connecting electrode are connected to each other.

The structure described above has the following effects. In the vicinity of the another connecting electrode, the direction in which the another connecting interconnection is routed and the direction coupling the intersecting point of the diagonal lines of the rectangular shape of the another substrate to the position where the another connecting interconnection and the another connecting electrode are connected to each other have a certain crossing angle, i.e., they are deviated from each other. Thus, compared to the case where these two directions match with each other, the strain stress being applied to the another connecting interconnection in the vicinity of the another connecting electrode becomes small. As a result, the adverse effect of the strain stress on the another connecting interconnection is alleviated, so that the reliability of the semiconductor device after mounting the substrate to the another substrate is improved.

Preferably, in the semiconductor device of the present invention according to either aspect above, the substrate may be a semiconductor substrate, and the another substrate may be a mounting board mounting a semiconductor substrate.

The semiconductor device according to a further aspect of the present invention includes: a semiconductor substrate; an externally connecting electrode provided in the semiconductor substrate; an externally connecting interconnection electrically connected to the externally connecting electrode and routed along a surface of the semiconductor substrate where the externally connecting electrode is provided; another connecting electrode electrically connected to the externally connecting electrode; a mounting board provided with the another connecting electrode; and another connecting interconnection having an end connected to the another connecting electrode and routed along a surface of the mounting board on which the another connecting electrode is provided. In the vicinity of a position where the anther connecting interconnection and the another connecting electrode are connected to each other, a direction in which the another connecting interconnection is routed has a crossing angle of greater than 0° and less than 180° with respect to a direction in which the mounting board expands and contracts due to thermal stress in the position where the anther connecting interconnection and the another connecting electrode are connected to each other.

The structure described above exhibits the following effects. In the vicinity of the another connecting electrode, the direction in which the another connecting interconnection is routed and the direction in which the mounting board expands and contracts due to the thermal stress have a certain crossing angle, i.e., they are deviated from each other. Thus, compared to the case where these two directions match with each other, the strain stress being applied to the another connecting interconnection in the vicinity of the another connecting electrode becomes small. As a result, the adverse effect of the strain stress on the another connecting interconnection is alleviated, so that the reliability of the semiconductor device after mounting the semiconductor substrate to the mounting board is improved.

In the semiconductor device of any aspect, the mounting board may be a dielectric substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

A structure of the semiconductor device according to the first embodiment and a manufacturing method thereof will be described with reference to FIGS. 1–6. First, the structure of the semiconductor device of the present embodiment will be described with reference to the top plan view in FIG. 1 and the cross sectional view in FIG. 2.

Figure 1:
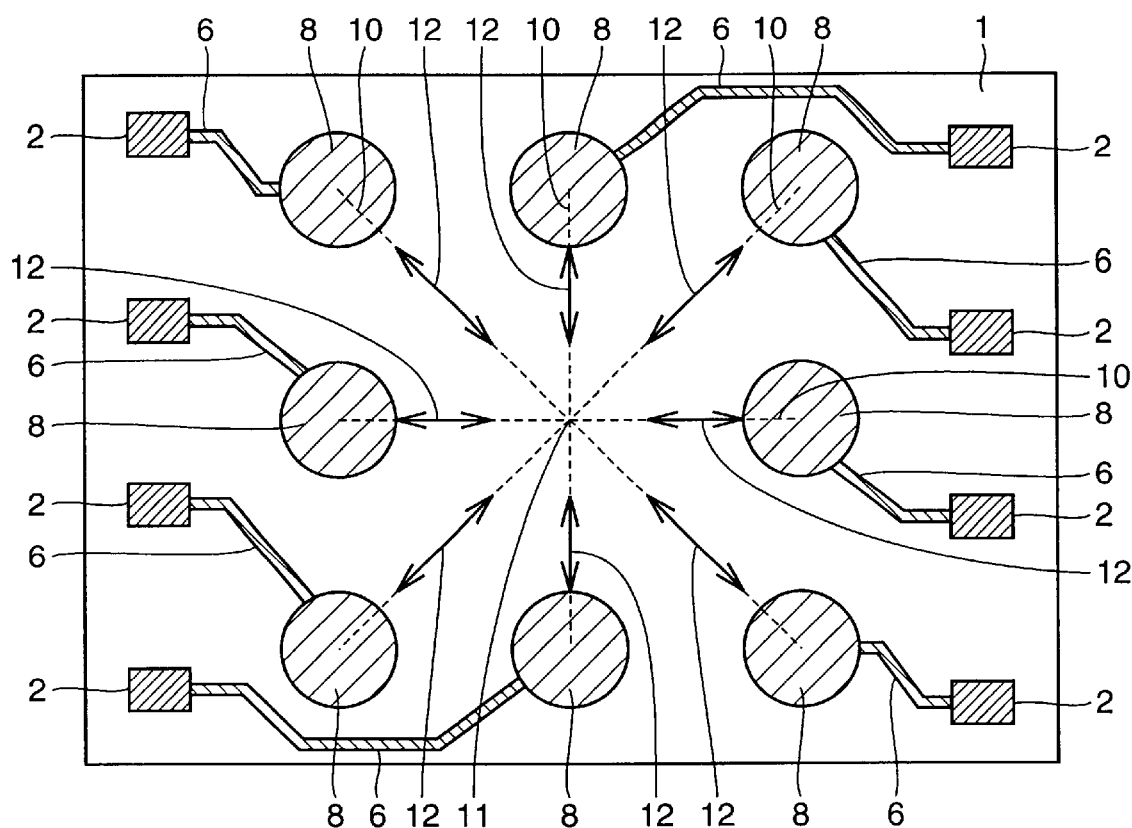
FIG. 1 illustrates a structure of an externally connecting interconnection of a semiconductor device according to a first embodiment of the present invention.
Figure 2:
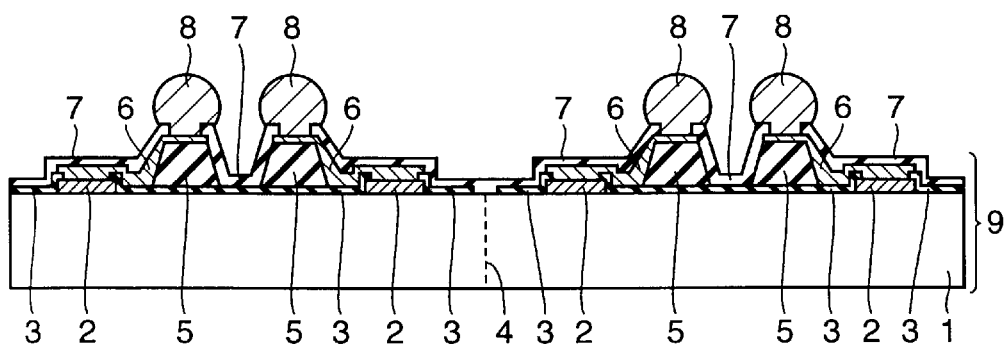
FIG. 2 illustrates a cross sectional structure of the semiconductor device of the first embodiment.

Referring to FIG. 2 showing semiconductor substrate 1 before being divided into individual semiconductor devices each as shown in FIG. 1, the semiconductor device 9 of the present embodiment includes: a semiconductor substrate 1 formed of a plurality of regions to be separated from each other; an electrode (hereinafter, referred to as "on-chip electrode") 2 that is formed on semiconductor substrate 1; an insulating film 3 formed on semiconductor substrate 1; a resin member 5 formed at a position where an externally connecting electrode is to be formed; a rewiring pattern 6; a protection film 7 for protecting rewiring pattern 6; and an externally connecting electrode 8. A dicing line 4 is provided at each boundary of the regions of semiconductor substrate 1 being separated from each other.

In the semiconductor device of the present embodiment, as shown in FIG. 2, resin members 5 of a low modulus of elasticity are formed separately from each other, immediately beneath respective externally connecting electrodes 8. Thus, in the case where thermal hysteresis occurs after semiconductor device 9 is mounted on a mounting board, even if thermal stress generated due to a difference between the thermal expansion coefficients of semiconductor device 9 and the mounting board is being applied to externally connecting electrodes 8, these resin members 5 serve to relax the thermal stress, thereby improving reliability of mounting of semiconductor device 9.

The structure of the semiconductor device of the present embodiment will now be described in more detail. In the semiconductor device of the present embodiment, as shown in FIG. 1, on-chip electrodes 2 are provided on the main surface of semiconductor substrate 1 of a rectangular shape. Also provided on semiconductor substrate 1 is rewiring pattern (hereinafter, also referred to as "interconnection(s)") 6, which constitutes the externally connecting interconnections of the present invention. Each interconnection 6 has one end connected to a corresponding on-chip electrode 2, and is routed from the upper surface of the relevant on-chip electrode 2 along the main surface of semiconductor substrate 1. The other end of interconnection 6 is electrically connected to a corresponding externally connecting electrode 8.

Electrically connecting electrodes 8 are placed near the periphery of semiconductor substrate 1. Electrically connecting electrodes 8 are to be connected to electrodes (hereinafter, referred to as "mounting-board electrodes") 88 provided on a mounting board 21, which will be described later with reference to FIG. 15, after semiconductor device 9 is mounted to the mounting board 21. Accordingly, compared to the case where externally connecting electrodes 8 are provided near the center of semiconductor substrate 1, strength of the electrodes 8 with respect to torsion being applied around the central axis of the main surface of semiconductor substrate 1 after semiconductor device 9 is mounted to mounting board 21, is increased.

In the interconnection structure of the semiconductor device of the present embodiment, as seen from FIG. 1, rewiring pattern 6 is arranged such that, in the vicinity of the position where interconnection 6 is connected to externally connecting electrode 8 corresponding thereto, a direction in which interconnection 6 is routed has a crossing angle (of approximately 45° or approximately 90°) with respect to a direction in which semiconductor substrate 1 would expand and contract due to thermal stress at the position where the relevant interconnection 6 and electrode 8 are connected to each other.

In other words, in the interconnection structure of the semiconductor device of the present embodiment, each interconnection of rewiring pattern 6 is made to extend from the position where it is connected to corresponding externally connecting electrode 8 for a certain distance in a direction having a crossing angle (of approximately 45° or approximately 90°) with respect to a direction coupling an intersecting point 11 of diagonal lines of the rectangle of the semiconductor substrate 1 to the position where the relevant interconnection 6 is connected to the corresponding electrode 8, which is shown by an arrow 12 in FIG. 1. Although the crossing angles are indicated as approximately 45° or approximately 90° in the present embodiment, any crossing angle of greater than 0° and less than 180° may be employed.

In the semiconductor device of the present embodiment, every interconnection of rewiring pattern 6 placed on semiconductor substrate 1 is formed with the externally connecting interconnection structure having the crossing angle described above. The crossing angle is preferably in a range between 45° and 135°, and more preferably in a range between 60° and 120°. This is because, the closer the crossing angle approximates to 90°, the more the direction in which interconnection 6 extends is deviated from the direction in which semiconductor substrate 1 will strain. The crossing angle, however, is not limited to 90° but a certain margin is allowed such that each interconnection of rewiring pattern 6 can be arranged with the shortest possible length.

Externally connecting electrode 8 and rewiring pattern 6 may be electrically connected to each other via a conductive member, e.g., a barrier metal film formed of nickel, that can suppress interdiffusion between electrode 8 and interconnection 6. Thus, contact resistance between externally connecting electrode 8 and rewiring pattern 6 constituting the externally connecting interconnections is decreased, so that conductivity in the vicinity of externally connecting electrode 8 is improved.

Further, as shown in FIG. 2, an insulating film 3 is formed on the upper surface of semiconductor substrate 1. Formed on the upper surface of insulating film 3 is a resin member 5 of a trapezoidal shape, which has an inclined plane with respect to the main surface of semiconductor substrate 1. Thus, externally connecting electrode 8 and semiconductor substrate 1 are provided with resin member 5 interposed therebetween. Rewiring pattern 6 is placed along the inclined plane of resin member 5, so that it has a relatively smooth structure in the vicinity of the connecting position of the pattern 6 and externally connecting electrode 8.

Rewiring pattern 6 has, at least in a portion thereof, a multi-layered structure made of two or more different kinds of materials. This permits formation of an interconnection structure having, e.g., a material exhibiting good workability and a material exhibiting good conductivity combined with each other.

Further, a protection film 7 is formed to cover semiconductor substrate 1, insulating film 3, resin member 5, rewiring pattern 6 and a portion of the surface of externally connecting electrode 8, to prevent damages thereto.

The interconnection structure of the present embodiment described above exhibits the following advantages.

Assume that the thermal expansion coefficient of semiconductor substrate 1 differs from that of mounting board 21. In this case, after semiconductor substrate 1 is mounted to mounting board 21, rewiring pattern 6 in the vicinity of externally connecting electrodes 8 will receive strain stress of a magnitude corresponding to the difference between the thermal expansion coefficients of semiconductor substrate 1 and mounting board 21.

In the structure of rewiring pattern 6 of the present embodiment, however, the direction in which externally connecting interconnection 6 is routed in the vicinity of externally connecting electrode 8 has a certain crossing angle with respect to the direction in which semiconductor substrate 1 expands and contracts due to thermal stress, or, in other words, it is deviated from the direction coupling the intersecting point of diagonal lines of the rectangle of semiconductor substrate 1 to the position where the relevant interconnection 6 is connected to the corresponding electrode 8. Accordingly, compared to the case where the direction in which rewiring pattern 6 is routed matches the direction in which semiconductor substrate 1 expands and contracts due to thermal stress, the strain stress being applied to rewiring pattern 6 in the vicinity of externally connecting electrode 8 becomes small. As a result, the adverse effect of the strain stress on rewiring pattern 6 is alleviated, so that reliability of the semiconductor device after mounting semiconductor substrate 1 to mounting board 21 is improved.

Moreover, the interconnection structure as described above is provided for every connecting portion of externally connecting electrode 8 and the corresponding interconnection of rewiring pattern 6. Thus, the strain stress being applied to the entire rewiring pattern 6 is reduced. As a result, damages caused by strain in the vicinity of all the connecting positions of rewiring pattern 6 and externally connecting electrode 8 can be reduced, which further improves the reliability of the semiconductor device.

Figure 3:
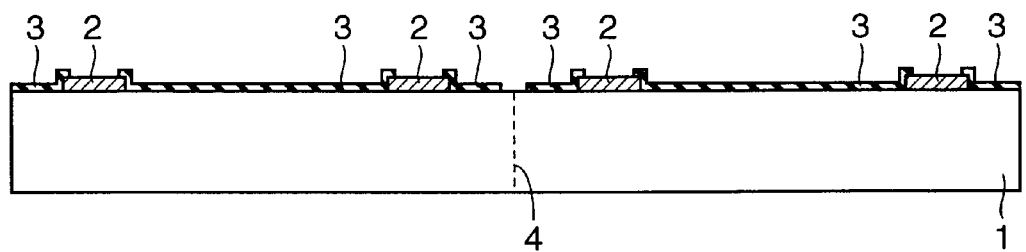
FIGS. 3–6 illustrate manufacturing steps of the semiconductor device of the first embodiment.

The manufacturing method of the semiconductor device of the present embodiment having the structure described above will now be described. FIGS. 2–6 show partial cross-sectional views of the semiconductor devices before being divided into pieces, taken to pass through externally connecting electrodes 8. In the manufacturing method of the semiconductor device of the present embodiment, as shown in FIG. 3, on-chip electrode 2 of aluminum, for example, is first formed on semiconductor substrate 1, followed by formation of insulating film 3 in a region other than the region where on-chip electrode 2 has been formed. Although insulating film 3 may be formed or not during the first few steps, it can be formed, for example, by spin coating a resin material such as polyimide over the entire surface of semiconductor substrate 1, and then making an opening where on-chip electrode 2 is being formed by photolithography or the like.

Figure 4:
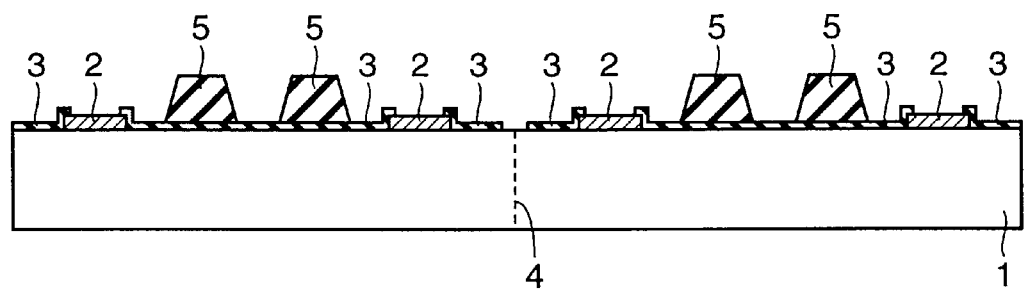

Next, as shown in FIG. 4, resin member 5 is formed on insulating film 3 having been formed on semiconductor substrate 1, at a position where externally connecting electrode Bis to be formed. Resin member Sis preferably made of a material that exhibits good adhesion to insulating film 3 and rewiring pattern 6. Not limited to epoxy system resin, silicone system resin or rubber system resin, resin of low elasticity modulus is desirable as it can efficiently relax stress after mounting. For externally connecting electrode 8 having a pitch of, e.g., 0.8 mm, resin member 5 may be formed by screen printing, using a metal stencil of about 0.1 mm thick, as a projection having a diameter of about 0.5 mm although the forming method thereof is not limited thereto.

Resin member 5 described above can efficiently relax the thermal stress generated after mounting semiconductor substrate 1 to mounting board 21, as long as respective resin members 5 are individually formed, by screen printing or the like, exclusively at the positions where externally connecting electrodes 8 are to be formed.

Figure 5:
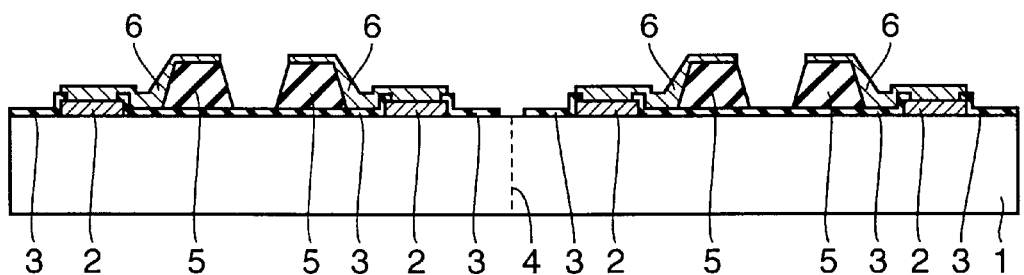

Next, as shown in FIG. 5, rewiring pattern 6 is formed to extend from the upper surface of on-chip electrode 2 to the upper surface of resin member 5 where externally connecting electrode 8 is to be formed. Rewiring pattern 6 is generally formed by plating, since electrolytic plating of, e.g., copper (Cu) to rewiring pattern 6 can reduce electrical resistance thereof, thereby preventing voltage drop, heat generation, signal delay or the like in rewiring pattern 6.

Further, since resin members 5 of the present embodiment have the inclined planes, rewiring pattern 6 can be formed to follow the inclined planes. Accordingly, rewiring pattern 6 can be formed in one step, so that a manufacturing process is simplified, which improves the productivity.

At the time of formation of rewiring pattern 6, a so-called barrier metal layer of nickel (Ni), for example, is formed at the on-chip electrode 2 portion so as to suppress interdiffusion between copper (Cu) and the soldering connecting portion being externally connecting electrode 8. When nickel is used, gold (Au), for example, is plated thereon, to prevent a problem of wetting between nickel and soldering. Electroless plating is employed at this time, since it has an advantage that nickel plating and gold plating can be conducted in one layer.

Rewiring pattern 6 described above is placed on the main surface of semiconductor substrate 1, as shown in FIG. 1. In FIG. 1, each dotted line 10 couples the intersecting point 11 of diagonal lines of semiconductor substrate 1 of a rectangular shape to respective externally connecting electrode 8. Each arrow 12 shows a direction in which strain will occur on the main surface of semiconductor substrate 1 in the vicinity of respective externally connecting electrode 8. When heat cycle hysteresis is applied after mounting the semiconductor device to the mounting board, due to the difference between the thermal expansion coefficient (2–4 ppm/° C.) of semiconductor substrate 1 and the thermal expansion coefficient (10–20 ppm/° C.) of mounting board 21, thermal expansion of the semiconductor substrate becomes smaller than that of the mounting board, thereby causing strain in the vicinity of respective externally connecting electrode 8. As a result, thermal strain stress is generated in the direction of thermal expansion, or the direction indicated by respective arrow 12.

Figure 13:
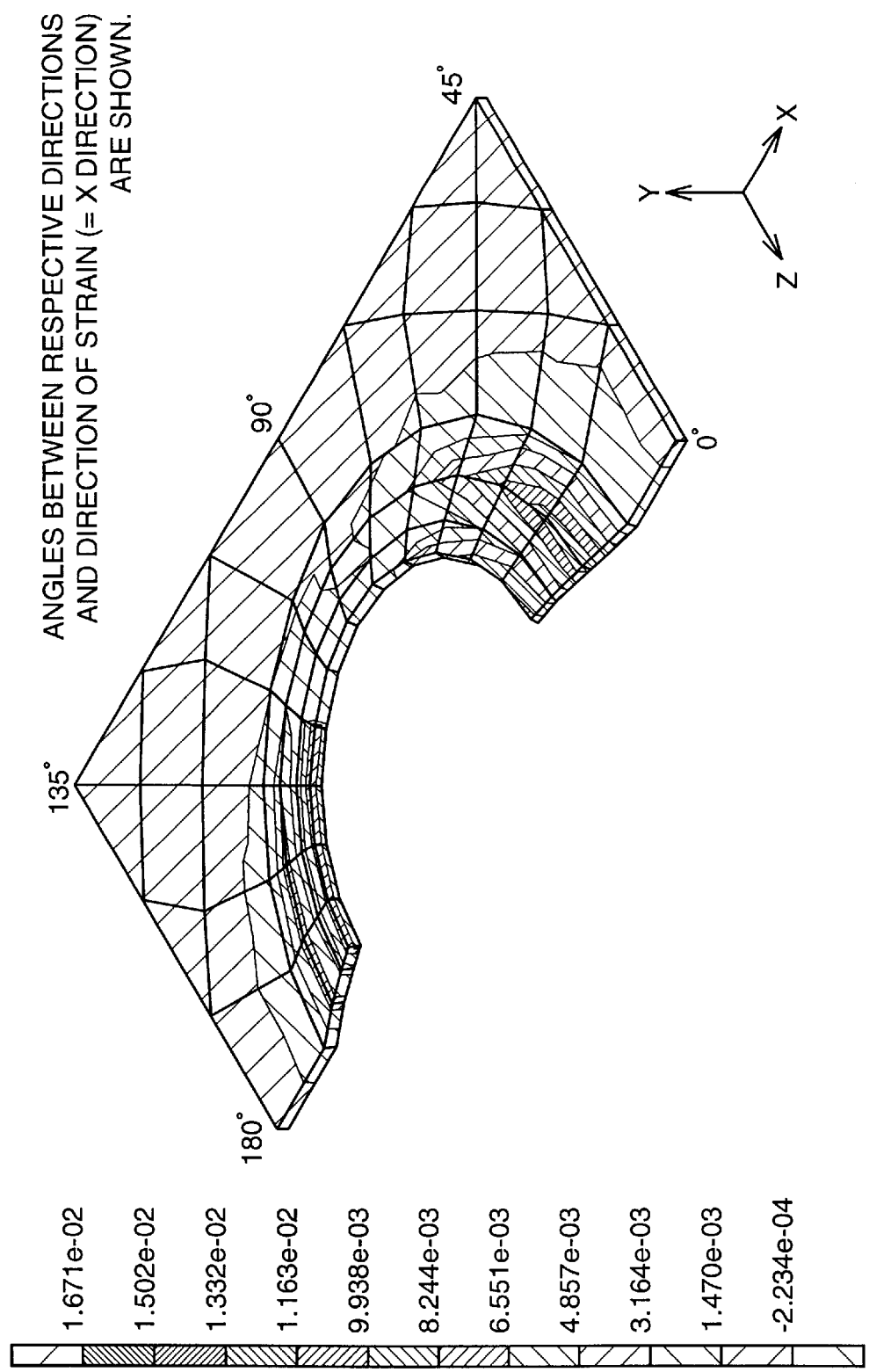
FIG. 13 shows distribution of elastic strain around a soldering connecting portion at the time when displacement is forcefully applied to the surface where the externally connecting electrode shown in FIG. 12 is connected.

Taking into consideration a result of a simulation model shown in FIG. 13 that will be described later, if rewiring pattern 6 is routed along the direction indicated by arrow 12 where strain will be generated, large thermal strain stress will be applied to rewiring pattern 6, which is considered to cause undesirable breaking of rewiring pattern 6. Thus, it should be preferable to avoid the direction of strain indicated by arrow 12 when routing rewiring pattern 6 from externally connecting electrode 8. The most effective direction of routing rewiring pattern 6 will be a direction making a right angle with the direction of strain indicated by arrow 12 in FIG. 1, where the adverse effect of the thermal strain stress is least expected. If, however, one sticks to the idea to route rewiring pattern 6 in the direction at 90° with the direction of strain, pattern 6 connecting externally connecting electrode 8 to on-chip electrode 2 may become lengthy, which would cause unnecessary electrical resistance. Thus, it is considered, taking into account the pattern of generation of strain in the simulation model in FIG. 13, that it is preferable to extend rewiring pattern 6 from externally connecting electrode 8 in a direction having a crossing angle from 45° to 135° with respect to the direction of strain, i.e., the X direction in FIG. 13.

Figure 6:
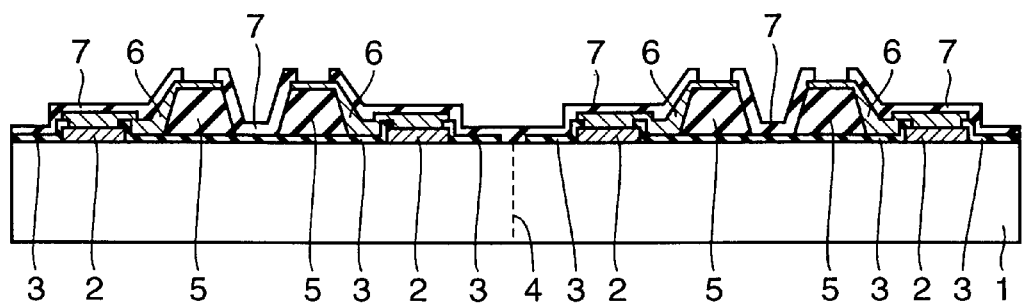

Next, as shown in FIG. 6, a protection film 7 is formed for protection of rewiring pattern 6 and the surface of semiconductor device 9 on which on-chip electrodes 2 have been placed. Protection film 7 is formed, e.g., by printing or photolithography using photosensitive resin. When the photolithography is being employed, the protection film may be formed by spin coating the photosensitive resin over the entire surface of semiconductor substrate 1, and then forming an opening at a position where externally connecting electrode 8 is to be formed.

Next, as shown in FIG. 2, externally connecting electrode 8 is formed on resin member 5. Specifically, a ball with a base of tin/lead eutectic alloys, for example, is mounted along with flux onto rewiring pattern 6 on resin member 5, and reflow soldering is conducted to form externally connecting electrode 8. The material of the ball is not limited to tin/lead. It may be formed with lead-free soldering, such as tin/silver/copper.

Lastly, semiconductor substrate 1 is cut along dicing lines 4 into pieces, so that semiconductor device 9 as shown in FIG. 1 is completed. All the manufacturing steps illustrated in FIGS. 2–6 can be done by wafer processing, using inexpensive printing processes wherever possible. Accordingly, it is possible to manufacture a semiconductor device at low cost, providing a structure sufficiently relaxing the thermal stress.

As described above, according to the semiconductor device of the present embodiment, resin member 5 formed at the position where externally connecting electrode 8 is to be formed enables relaxation of thermal stress after mounting of semiconductor substrate 1 to mounting board 21. In addition, rewiring pattern 6 that is electrically connected to externally connecting electrode 8 can be routed avoiding the direction in which strain will be created. Accordingly, stress being applied to rewiring pattern 6 is reduced, and thus, breaking or disconnection of rewiring pattern 6 can be suppressed.

Figure 12:
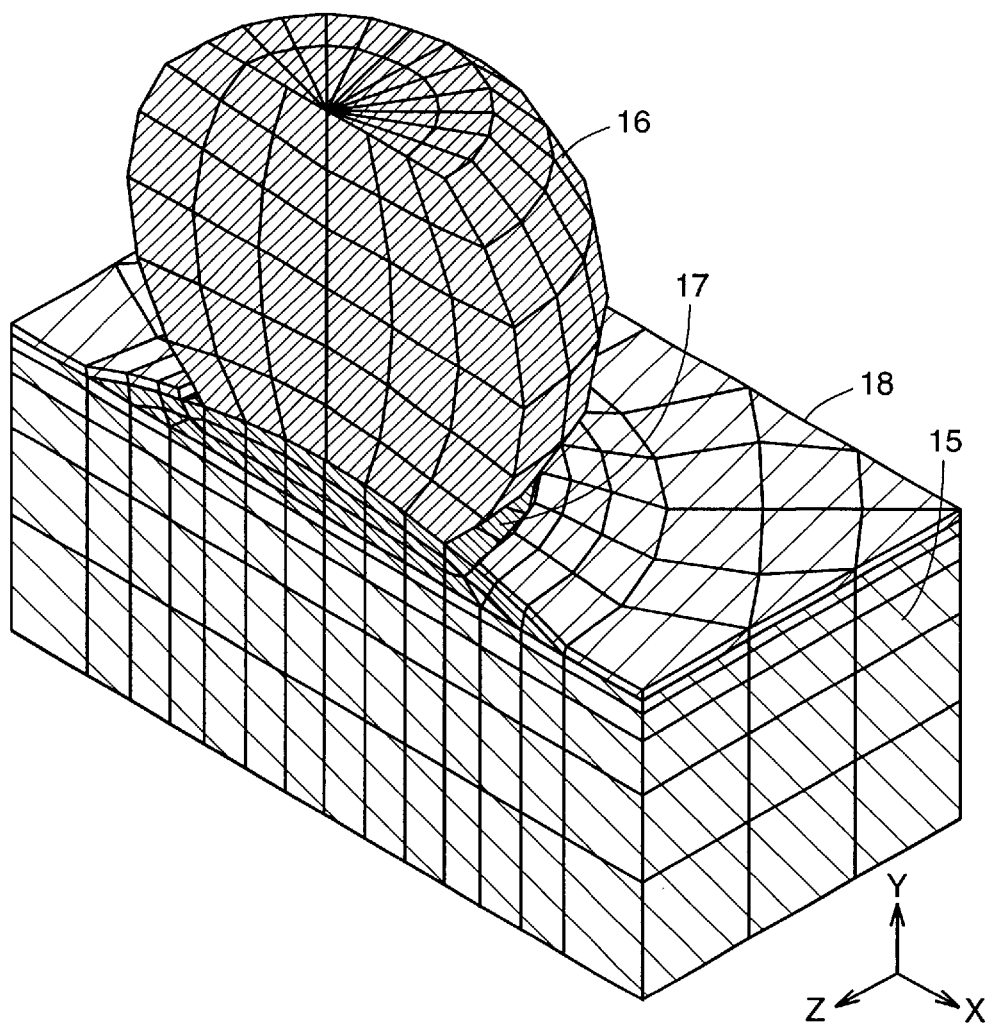
FIG. 12 shows a model of an externally connecting electrode and a surrounding region thereof, which is cut into half.

Strain that will be produced in the vicinity of an externally connecting electrode when thermal stress is generated after mounting the semiconductor device of the present embodiment will now be described with reference to FIG. 12. FIG. 12 shows a model of one soldering connecting portion cut into half. In this model, soldering connecting portion 16 is formed on the upper surface of semiconductor substrate 15 with resin layer 17 interposed therebetween for the purposes of relaxing the stress, and protection film 18 is formed on the upper surface of semiconductor substrate 15 around the soldering connecting portion 16. Semiconductor substrate 15, soldering connecting portion 16, resin layer 17 and protection film 18 of this model correspond to semiconductor substrate 1, externally connecting electrode 8, resin layer 5 and protection film 7, respectively, of the present embodiment. In this model, resin layer 17 is regarded as of a "drop shape" type, on the assumption that resin layer 5 of the present embodiment is formed by printing exclusively at the position where externally connecting electrode 8 is to be formed, instead of being formed by spin coating or the like on the entire surface of semiconductor substrate 1.

Using this model, distribution of elastic strain equivalent to the case where the surface of soldering connecting portion 16 that is connected to semiconductor substrate 15, or the top surface of resin layer 17 is forcefully displaced by 17.5 $\mu$m in the X direction, was calculated. This value of 17.5 $\mu$m corresponds to the difference in length in one direction of strain that would be generated between semiconductor substrate 1 and mounting board 21 in the soldering connecting portion that is located farthest from the center or the intersecting point of diagonal lines of 16-mm square chip, in the case where there occurs a temperature difference of 165° C. (=125° C.–(–40° C.)) after mounting semiconductor substrate 1 to mounting board 21. The temperature difference of 165° C. from –40° C. to 125° C. is a temperature cycle condition of reliability testing that is conducted to guarantee the mounting reliability.

A result of the simulation to obtain the distribution of elastic strain that would be applied to protection film 18 around soldering connecting portion 16 when forcefully displacing the model of FIG. 12 as described above, is shown in FIG. 13. According to the result, the strain is generated from the neutral point of the model in the direction of displacement, while the strain is hardly generated in a direction at a right angle with the direction of displacement. The result shows that the most effective direction for routing the rewiring pattern is the direction making an angle of 90° with the direction of X-axis in FIG. 12, which is least likely to suffer the thermal stress. It can be said that, the smaller the crossing angle between the direction in which rewiring pattern 6 is routed and the direction in which semiconductor substrate 1 and the mounting board are displaced from each other according to expansion/contraction due to thermal expansion, the more the effect of the thermal stress is expected. Thus, it is expected that connecting portion 16 will be considerably affected by the strain if the crossing angle between the direction in which rewiring pattern 6 is routed and the direction in which semiconductor substrate 1 and mounting board 10 are strained falls in a range between 0° and 45° or between 135° and 180°.

In the semiconductor device of the present embodiment, when heat is applied after mounting semiconductor device 9 to mounting board 21, thermal expansion of semiconductor substrate 1 having the thermal expansion coefficient of 2–4 ppm/° C. is small compared to that of mounting board 21 having the thermal expansion coefficient of 10–20 ppm/° C. As a result, outwardly directed thermal stress will be applied to externally connecting electrode 8, and, in rewiring pattern 6 in the vicinity of externally connecting electrode 8, strain will be generated in the direction from the center 11 of semiconductor substrate 1, shown in FIG. 1, towards externally connecting electrode 8. Thus, as described above, it is determined that the crossing angle in a range between 45° and 135° is preferable, and that between 60° and 120° is more preferable.

Preferably, at least interconnections 6 connected to externally connecting electrodes 8 located in the four corners of the semiconductor substrate that would suffer the largest effects of the stress, are routed with the crossing angles described above. More preferably, all the interconnections 6 connected to externally connecting electrodes 8 are routed with the crossing angles described above.

Second Embodiment

A structure of the semiconductor device according to the second embodiment and a manufacturing method thereof will now be described with reference to FIGS. 7–11. The structure of the semiconductor device of the present embodiment will be described first with reference to FIG. 7. In the semiconductor device of the present embodiment, an insulating film 3 is formed on the main surface of a semiconductor substrate 1 of a rectangular shape, and on-chip electrode 2 is provided in a region other than the region where insulating film 3 has been formed. Formed on on-chip electrode 2 and insulating film 3 is a rewiring pattern 6 that constitutes a part of the externally connecting interconnections of the present invention. Rewiring pattern 6 has an end electrically connected to on-chip electrode 2, and extends from on-chip electrode 2 along the main surface of semiconductor substrate 1. The other end of rewiring pattern 6 is connected to a conductive embedded member 14 that constitutes another part of the externally connecting interconnections of the present invention, so that rewiring pattern 6 is electrically connected to externally connecting electrode 8. A resin layer 13b is formed to cover the main surface of semiconductor substrate 1, on-chip electrode 2, insulating film 3 and rewiring pattern 6.

The manufacturing method of the semiconductor device of the present embodiment will now be described with reference to FIGS. 7–11. The manufacturing method of the semiconductor device of the present embodiment differs from that of the first embodiment shown in FIGS. 2–6 in the way of forming rewiring pattern 6.

Figure 8:
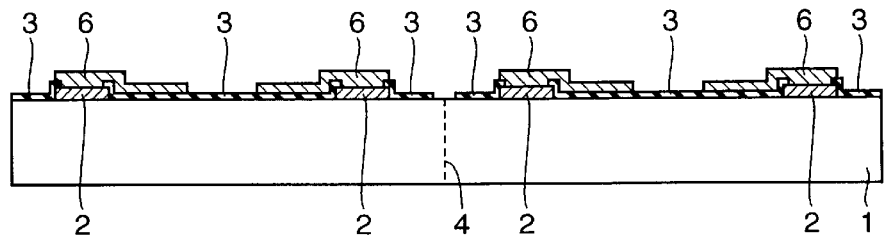
FIGS. 8–11 illustrate manufacturing steps of the semiconductor device of the second embodiment.

In the manufacturing method of the semiconductor device of the present embodiment, first, as shown in FIG. 8, an insulating film 3 and on-chip electrode 2 are formed on semiconductor substrate 1, in the same manner as in the first embodiment as shown in FIG. 3. Thereafter, rewiring pattern 6 is formed to extend from the upper surface of on-chip electrode 2 to a position on insulating film 3 immediately beneath the position where externally connecting electrode 8 is to be formed. Rewiring pattern 6 is formed in the same manner as in the first embodiment as shown in FIG. 5. The direction in which rewiring pattern 6 is placed is the same as in the first embodiment as shown in FIG. 1.

Figure 9:
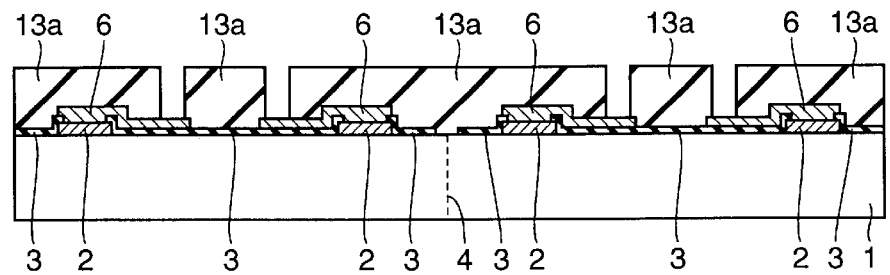

Next, as shown in FIG. 9, a resin layer is formed on the entire surface of semiconductor substrate 1, and then a contact hole for connection with rewiring pattern 6 is formed, so that resin layer 13a is formed.

Figure 10:
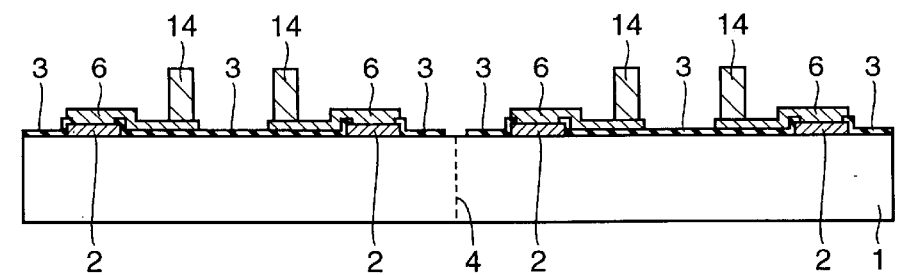

Next, plating is applied to the surface of the contact hole in resin layer 13a formed in the step shown in FIG. 9, and embedded member 14 is formed to fill in the contact hole. As the material of embedded member 14, copper, nickel or others may be employed. Thereafter, resin layer 13a is removed, as shown in FIG. 10.

Figure 7:
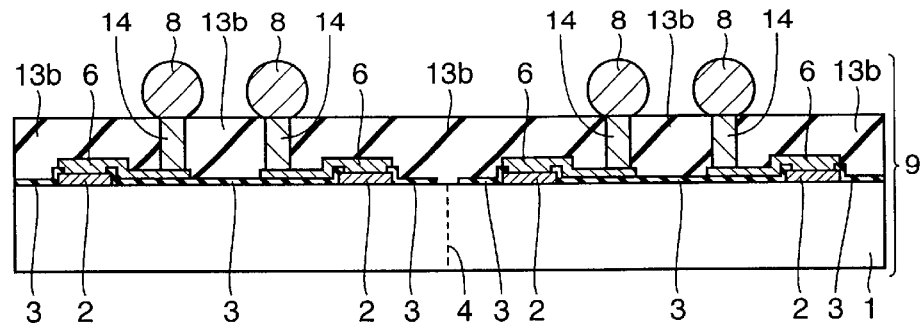
FIG. 7 illustrates a cross sectional structure of a semiconductor device according to a second embodiment of the present invention.
Figure 11:
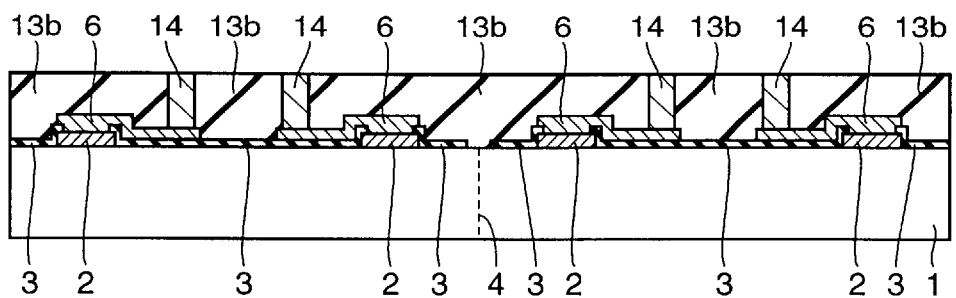

Thereafter, as shown in FIG. 11, a resin layer 13b is formed for protection of rewiring pattern 6 and others on semiconductor substrate 1. Next, as shown in FIG. 7, externally connecting electrode 8 is formed in the same manner as in the first embodiment as shown in FIG. 2. Thereafter, semiconductor substrate 1 is cut along dicing lines 4 into pieces, so that the semiconductor device of the present embodiment is completed.

Rewiring pattern 6 of the semiconductor device according to the present embodiment has the planar structure as in the first embodiment shown in FIG. 1. Thus, the semiconductor device having an interconnection structure that can prevent disconnection of rewiring pattern 6 due to strain caused by thermal stress being generated after mounting the semiconductor substrate on the mounting board, is realized.

The semiconductor device 9 and mounting board 21 described in the first and second embodiments may be respectively formed of a semiconductor substrate and a dielectric substrate of, e.g., ceramics on which a semiconductor substrate is mounted. A third substrate for mounting the dielectric substrate may also be provided.

Third Embodiment

Figure 14:
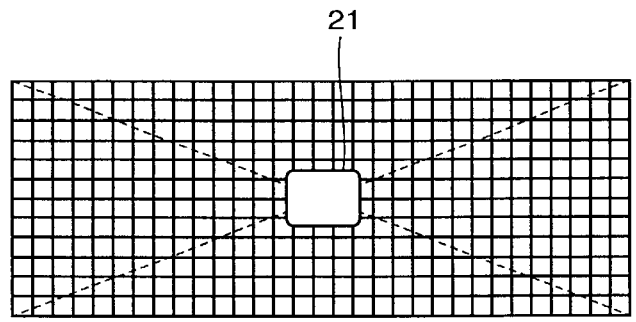
FIG. 14 shows a structure of a mounting board according to a third embodiment of the present invention.

A mounting board 21 for mounting the semiconductor device according to the third embodiment will now be described with reference to FIGS. 14 and 15. The semiconductor device and the mounting board of the present embodiment are stacked one on the other, as shown in FIG. 14, to have a common intersecting point of diagonal lines of the rectangles.

The structure of the mounting board for mounting the semiconductor device according to the present embodiment will be described first. After the semiconductor device 9 as shown in the fist and second embodiments is mounted, externally connecting electrode 8 is connected to a mounting-board connecting electrode 88 provided on the mounting board 21 of an approximately rectangular shape as shown in FIG. 15. A mounting-board connecting interconnection 66 is placed on the main surface of mounting board 21, which has its end connected to mounting-board electrode 88 and extends along the main surface of mounting board 21.

In the mounting board of the semiconductor device of the present embodiment, when thermal stress is applied to the soldering connecting portion by thermal hysteresis after mounting semiconductor substrate 1 to mounting board 21 as in the semiconductor devices of the first and second embodiments, strain stress will be applied not only to the semiconductor substrate 1 side but also to mounting-board electrode 88 portion on the mounting board 21 side.

Thus, in the structure of mounting-board connecting interconnection 66 of the present embodiment, as in the structure of the externally connecting interconnection (rewiring pattern 6) of the semiconductor devices of the first and second embodiments, mounting-board connecting interconnection 66 in the vicinity of the position where it is connected to mounting-board connecting electrode 88 is extended in a direction having a crossing angle (of approximately 45° or approximately 90°) with respect to a direction in which mounting board 21 expands and contracts due to thermal stress at the connecting position of interconnection 66 and electrode 88.

Figure 15:
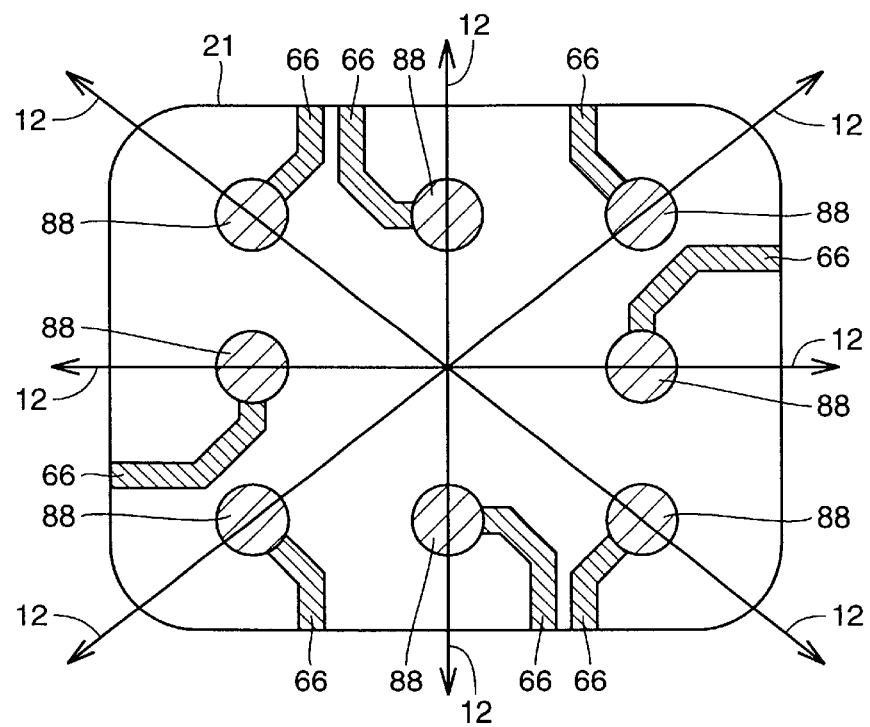
FIG. 15 shows a rewiring pattern on the mounting board side of the third embodiment.
Figure 16:
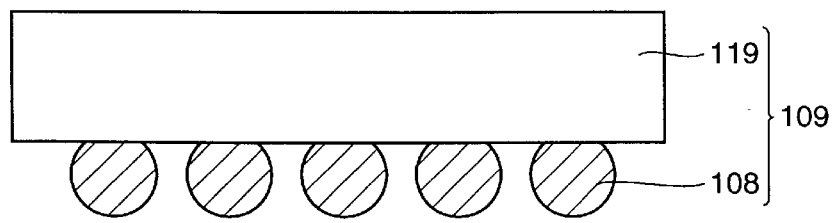
FIG. 16 shows an example of a conventional bare chip for which molding has not been applied.
Figure 17:
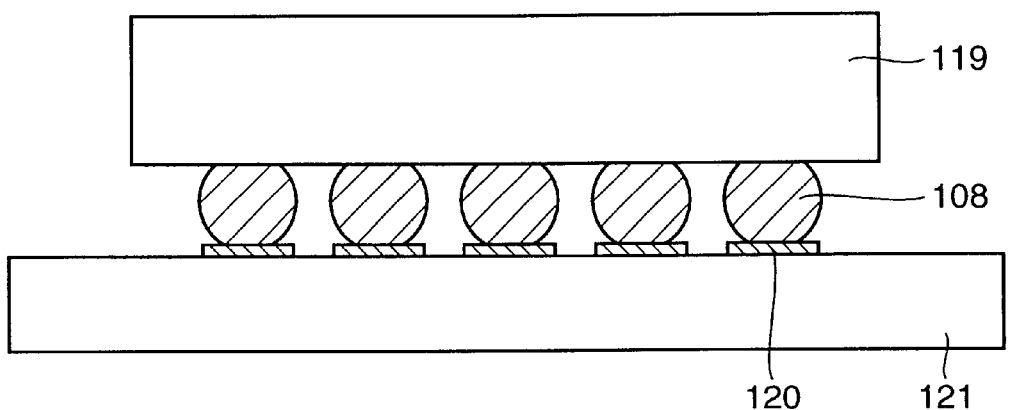
FIG. 17 shows the conventional unmolded bare chip being mounted on a mounting board.
Figure 18:
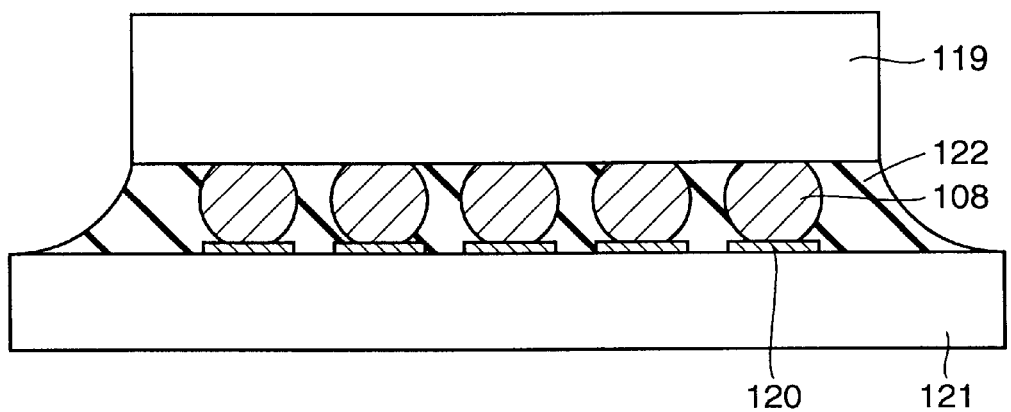
FIG. 18 illustrates a bare chip being mounted with "underfill" as a conventional way of mounting a semiconductor device.

In other words, the direction in which mounting-board connecting interconnection 66 is routed in the vicinity of the position where it is connected to mounting-board connecting electrode 88 is configured to have a crossing angle (of approximately 45° or approximately 90°) with respect to a direction coupling the intersecting point of the diagonal lines of the rectangle formed by the outline of mounting board 21 to the connecting point of mounting-board connecting interconnection 66 and mounting-board connecting electrode 88, which is indicated by an arrow 12 in FIG. 15.

In the present embodiment, the crossing angles of approximately 45° or approximately 90° have been described. However, not limited thereto, any crossing angle of greater than 0° and less than 180° may be employed.

Such a structure exhibits the following effects when mounting semiconductor substrate 1 to mounting board 21. In the mounting board of the present embodiment, the direction in which mounting-board connecting interconnection 66 is routed in the vicinity of mounting-board connecting electrode 88 and the direction in which the mounting board expands and contracts due to the thermal stress have a certain crossing angle, or, they are deviated from each other. Thus, compared to the case where the two directions match with each other, the stress that would be applied to mounting-board connecting interconnection 66 in the vicinity of mounting-board connecting electrode 88 becomes small.

In other words, compared to the case where the direction in which mounting-board connecting interconnection 66 is routed matches the direction coupling the intersecting point of diagonal lines of the rectangle being the outline of mounting board 21 to the position where mounting-board connecting interconnection 66 and mounting-board connecting electrode 88 are connected to each other, mounting-board connecting interconnection 66 in the vicinity of mounting-board connecting electrode 88 will suffer small strain stress. As a result, the adverse effect of the strain stress on mounting-board connecting interconnection 66 is alleviated, and thus, the reliability of the semiconductor device after mounting board 21 is mounted to another substrate is improved. In addition, the adverse effect of strain stress can be suppressed without increasing the width of mounting-board connecting interconnection 66, so that the mounting board allows for a high-density interconnection structure.

The manufacturing method of the mounting board for mounting the semiconductor device will now be described. The way of forming mounting-board connecting interconnection 66 as the mounting board connecting interconnection of the present invention is identical to the way of forming rewiring pattern 6 in the first and second embodiments, in which copper, nickel or the like is plated. For example, if copper (Cu) is applied by electrolytic plating, electrical resistance of mounting-board connecting interconnection 66 is restricted to a small level, so that voltage drop, heat generation, signal delay or the like can be prevented.

Further, after the formation of mounting-board connecting interconnection 66, a so-called barrier metal layer is formed with nickel (Ni), for example, to prevent interdiffusion between copper and soldering being mounting-board connecting electrode 88. When nickel is being employed, gold (Au) or the like is plated thereon, to prevent a problem of wetting between nickel and soldering.

In the present embodiment, again, the crossing angle between 45° and 135° is preferable, and that between 60° and 120° is more preferable. Further, at least mounting-board connecting interconnections 66 connected to mounting-board connecting electrodes 88 located in four corners of the mounting board, which will be affected by the stress most, are preferably routed to have the crossing angles as described above. More preferably, all the mounting-board connecting interconnections 66 connected to mounting-board connecting electrodes 88 are routed to have such crossing angles. In the present embodiment, the case where semiconductor device 9 is connected to mounting board 21 has been described. However, the distinctive feature of the present embodiment is the direction for routing mounting-board connecting interconnection 66 on mounting board 21. The semiconductor device to be mounted is not limited to semiconductor device 9 described in the first and second embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a substrate;

an externally connecting electrode provided in said substrate, having a resin member interposed between said externally connecting electrode and said substrate and immediately beneath respective said externally connecting electrode; and an externally connecting interconnection electrically connected to said electrically connecting electrode and routed along a surface of said substrate on which said externally connecting electrode is provided, wherein in the vicinity of a position where said externally connecting interconnection and said electrically connecting electrode are connected to each other, a direction in which said externally connecting interconnection is routed has a crossing angle of greater than 0° and less than 180° with respect to a direction in which said substrate expands and contracts due to thermal stress at the position where said externally connecting interconnection and said externally connecting electrode are connected to each other.

2. The semiconductor device according to claim 1, wherein at least said externally connecting interconnections connected to said externally connecting electrodes located in four corners of said substrate have said crossing angles.

3. The semiconductor device according to claim 1, wherein all said externally connecting interconnections placed on said substrate have said crossing angles.

4. The semiconductor device according to claim 1, wherein said crossing angle is in a range between 45° and 135°.

5. The semiconductor device according to claim 1, wherein said crossing angle is in a range between 60° and 120°.

6. The semiconductor device according to claim 1, wherein said externally connecting electrode is arranged near a periphery of said substrate.

7. The semiconductor device according to claim 1, wherein said resin member having an inclined plane with respect to the surface of said substrate on which said externally connecting electrode is provided, and said externally connecting interconnection is routed to follow said inclined plane.

8. The semiconductor device according to claim 1, further comprising:

another connecting electrode electrically connected to said externally connecting electrode;

another substrate having said another connecting electrode provided therein; and another connecting interconnection having an end connected to said another connecting electrode and routed along a surface of said another substrate on which said another connecting electrode is provided.

9. The semiconductor device according to claim 8, wherein in the vicinity of a position where said another connecting interconnection and said another connecting electrode are connected to each other, a direction in which said another connecting interconnection is routed has a crossing angle of greater than 0° and less than 180° with respect to a direction in which said another substrate expands and contracts due to thermal stress at the position where said another connecting interconnection and said another connecting electrode are connected to each other.

10. The semiconductor device according to claim 8, wherein said another substrate is formed to have its main surface shaped into a rectangle, and in the vicinity of a position where said another connecting interconnection and said another connecting electrode are connected to each other, a direction in which said another connecting interconnection is routed has a crossing angle of greater than 0° and less than 180° with respect to a direction coupling an intersecting point of diagonal lines of said rectangle to the position where said another connecting interconnection and said another connecting electrode are connected to each other.

11. The semiconductor device according to claim 1, wherein said substrate is a semiconductor substrate.

12. The semiconductor device according to claim 8, wherein said another substrate is a mounting board for mounting a semiconductor substrate.

13. The semiconductor device according to claim 12, wherein said mounting board is a dielectric substrate.

14. A semiconductor device, comprising:

a substrate having a main surface shaped into a rectangle;

an externally connecting electrode provided in said substrate, having a resin member interposed between said externally connecting electrode and said substrate and immediately beneath respective said externally connecting electrode; and an externally connecting interconnection electrically connected to said electrically connecting electrode and routed along a surface of said substrate on which said externally connecting electrode is provided, wherein in the vicinity of a position where said externally connecting interconnection and said electrically connecting electrode are connected to each other, a direction in which said externally connecting interconnection is routed has a crossing angle of greater than 0° and less than 180° with respect to a direction coupling an intersecting point of diagonal lines of said rectangle to the position where said externally connecting interconnection and said externally connecting electrode are connected to each other.

15. The semiconductor device according to claim 14, wherein at least said externally connecting interconnections connected to said externally connecting electrodes located in four corners of said substrate have said crossing angles.

16. The semiconductor device according to claim 14, wherein all said externally connecting interconnections placed on said substrate have said crossing angles.

17. The semiconductor device according to claim 14, wherein said crossing angle is in a range between 45° and 135°.

18. The semiconductor device according to claim 14, wherein said crossing angle is in a range between 60° and 120°.

19. The semiconductor device according to claim 14, wherein said externally connecting electrode is placed near a periphery of said substrate.

20. The semiconductor device according to claim 14, wherein said resin member having an inclined plane with respect to the surface of said substrate on which said externally connecting electrode is provided, and said externally connecting interconnection is routed to follow said inclined plane.

21. The semiconductor device according to claim 14, further comprising:

another connecting electrode electrically connected to said externally connecting electrode;

another substrate having said another connecting electrode provided therein; and another connecting interconnection having an end connected to said another connecting electrode and routed along a surface of said another substrate on which said another connecting electrode is provided.

22. The semiconductor device according to claim 21, wherein in the vicinity of a position where said another connecting interconnection and said another connecting electrode are connected to each other, a direction in which said another connecting interconnection is routed has a crossing angle of greater than 0° and less than 180° with respect to a direction in which said another substrate expands and contracts due to thermal stress at the position where said another connecting interconnection and said another connecting electrode are connected to each other.

23. The semiconductor device according to claim 21, wherein said another substrate is formed to have its main surface shaped into a rectangle, and in the vicinity of a position where said another connecting interconnection and said another connecting electrode are connected to each other, a direction in which said another connecting interconnection is routed has a crossing angle of greater than 0° and less than 180° with respect to a direction coupling an intersecting point of diagonal lines of said rectangle to the position where said another connecting interconnection and said another connecting electrode are connected to each other.

24. The semiconductor device according to claim 14, wherein said substrate is a semiconductor substrate.

25. The semiconductor device according to claim 21, wherein said another substrate is a mounting board for mounting a semiconductor substrate.

26. The semiconductor device according to claim 25, wherein said mounting board is a dielectric substrate.

27. A semiconductor device, comprising:

a semiconductor substrate;

an externally connecting electrode provided in said semiconductor substrate, having a resin member immediately beneath respective said externally connecting electrode;

an externally connecting interconnection electrically connected to said externally connecting electrode and routed along a surface of said semiconductor substrate on which said externally connecting electrode is provided;

another connecting electrode electrically connected to said externally connecting electrode;

a mounting substrate having said another connecting electrode provided therein; and another connecting interconnection having an end connected to said another connecting electrode and routed along a surface of said mounting substrate on which said another connecting electrode is provided, wherein in the vicinity of a position where said another connecting interconnection and said another connecting electrode are connected to each other, a direction in which said another connecting interconnection is routed has a crossing angle of greater than 0° and less than 180° with respect to a direction in which said mounting substrate expands and contracts due to thermal stress at the position where said another connecting interconnection and said another connecting electrode are connected to each other.

28. The semiconductor device according to claim 27, wherein said mounting substrate is a dielectric substrate.

\* \* \* \* \*